United States Patent
DeMaggio et al.

(10) Patent No.: US 7,923,341 B2
(45) Date of Patent: Apr. 12, 2011

(54) HIGHER SELECTIVITY, METHOD FOR PASSIVATING SHORT CIRCUIT CURRENT PATHS IN SEMICONDUCTOR DEVICES

(75) Inventors: Greg DeMaggio, Ann Arbor, MI (US); Hellmut Fritzsche, Tucson, AZ (US); Ginger Pietka, Harrison Township, MI (US)

(73) Assignee: United Solar Ovonic LLC, Auburn Hills, MI (US)

( * ) Notice: Subject to any disclaimer, the term of this patent is extended or adjusted under 35 U.S.C. 154(b) by 0 days.

(21) Appl. No.: 12/455,503

(22) Filed: Jun. 3, 2009

(65) Prior Publication Data
US 2009/0246907 A1 Oct. 1, 2009

Related U.S. Application Data

(63) Continuation-in-part of application No. 12/322,395, filed on Feb. 2, 2009, now abandoned, which is a continuation-in-part of application No. 11/891,737, filed on Aug. 13, 2007, now Pat. No. 7,485,474.

(51) Int. Cl.
*H01L 21/20* (2006.01)

(52) U.S. Cl. .............. 438/381; 428/14; 428/38; 428/88; 428/190; 428/210; 257/E21.056

(58) Field of Classification Search .................. 438/14, 438/958, 38, 171, 190, 210, 381; 257/E21.056
See application file for complete search history.

(56) References Cited

U.S. PATENT DOCUMENTS 5,084,400 A * 1/1992 Nath et al. ...................... 438/88
* cited by examiner

*Primary Examiner* — Hoai v Pham
*Assistant Examiner* — Elias Ullah
(74) *Attorney, Agent, or Firm* — David W. Schumaker

(57) ABSTRACT

A method for passivating short circuit defects in a thin film large area photovoltaic device in accordance with an exemplary embodiment is provided. The method employs a passivation agent and a counter electrode disposed in said passivation agent. The method includes controlling an application of current between the substrate of said photovoltaic device and said counter electrode so as to ensure high selectivity of modification of a transparent conductive oxide material of said photovoltaic module adjacent said short circuit defect, while leaving the transparent conductive oxide material of said photovoltaic module of non-defect areas in its unmodified form.

1 Claim, 6 Drawing Sheets

HIGHER SELECTIVITY, METHOD FOR PASSIVATING SHORT CIRCUIT CURRENT PATHS IN SEMICONDUCTOR DEVICES

RELATED APPLICATION DATA

The present application is filed under 35 USC §1.53(b) as a Continuation-in-Part of U.S. patent application Ser. No. 12/322,395, filed on Feb. 2, 2009 now abandoned which is a Continuation-in-Part of U.S. patent application Ser. No. 11/891,737, filed on Aug. 13, 2007 now U.S. Pat. No. 7,485,474, both of which are hereby incorporated herein by reference.

FIELD OF THE INVENTION

The instant invention relates generally to passivation of short circuit current paths within thin film semiconductor devices. More specifically this application relates to improvements in the passivation of short circuit current paths by the electrochemical modification of portions of a conductive electrode adjacent to the short circuit pathways. Most specifically, the present invention relates to methods which more selectively isolate smaller regions of the electrically conductive electrode, thereby reducing the loss of non-shorted regions of the semiconductor.

BACKGROUND OF THE INVENTION

Deposition apparatus have been widely used for manufacturing semiconductor devices such as photoresponsive devices, thin-film transistors, integrated circuits, device arrays, displays, and the like.

Thin film semiconductor materials offer several distinct advantages over crystalline wafer materials, insofar as they can be easily and economically fabricated into a variety of devices by mass production processes. Thin film semiconductor materials contemplated herein include amorphous, partially amorphous, and nanocrystalline. However, in the fabrication of thin film electronic devices such as photovoltaic devices, the presence of current-shunting, short circuit defects has been observed. These defects have (1) seriously impaired the performance of the electronic devices fabricated therefrom and (2) detrimentally affected production yield. These process-related defects are thought to either be present in the morphology of the substrate or back electrode; or develop during the deposition or subsequent processing of the intermediate semiconductor, dielectric or superconducting layers. Eliminating or at least substantially reducing the effects of these current-shunting defects has been the focus of much research.

The most important of these defects may be characterized as shunts, short-circuits, low resistance defect regions or low resistance current paths, such terms being employed interchangeably herein. Before the suspected causes of these defects are explained, it is helpful to note the typical thicknesses of the deposited intermediate layers. For example, in a p-i-n type electronic thin film device, a typical "p" layer may be only on the order of 250 angstroms thick, a typical "i" layer may be only on the order of 3,500 angstroms thick, and a typical "n" layer may be only on the order of 250 angstroms thick, thereby providing a total semiconductor body thickness of only about 4,000 angstroms. It should therefore be appreciated that irregularities, however, small, are not easy to cover by the deposited semiconductor layers.

Shunt defects are present when one or more low resistance current paths develop through the intermediate body of the device allowing current to pass unimpeded between the electrodes thereof. Under operating conditions, a photovoltaic device in which a shunt defect has developed, exhibits either (1) a low power output, since some of the electrical current collected at the electrodes flows through the defect region (the path of least resistance) in preference to an external load, or (2) complete failure where sufficient current is shunted through the defect region to "burn out" the device. Similarly, in thin film electronic resistive devices current is either shunted through the defect region resulting in severely degraded performance of the device, or the defect results in total, complete failure of the device.

While shunt-type defects always deleteriously affect the performance of electronic devices, their effect is particularly profound in photovoltaic devices which are operated under relatively low illumination, such as room light, vis-a-vis, high intensity illumination such as an AM-1 solar spectrum. Under room light illumination, the load resistance of the cell (i.e., the resistance under which the cell is designed to operate most efficiently) is comparable to the shunt resistance (i.e., the internal resistance imposed by the defect regions), whereas under AM-1 illumination, the load resistance is much lower by comparison. Furthermore, in a photovoltaic device, photogenerated current increases linearly with increasing illumination, while the resulting voltage increases logrithmically. In other words, voltage attains a relatively high value under low illumination, the value increasing only slightly as the intensity of the illumination is increased. The result is that under low illumination the relatively high voltage potential present preferentially drives the relatively small number of photogenerated current carriers through the path of least resistance, i.e., the low resistance defect regions. In contrast thereto, under high illumination, a large number of current carriers are present and are driven by a potential of about the same magnitude as the potential which exists under low illumination. This larger number of current carriers compete for a limited number of least resistance paths (through the defect regions). The result is that at high intensity, while more power may be lost to the defect region, the power lost is a smaller percentage of the total power produced than at low intensity illumination.

Defects or defect regions, the terms being interchangeably used herein, are not limited to "overt" or "patent" short circuit current paths. In some cases, the adverse effects of a defect are latent and do not immediately manifest themselves. Latent defects can give rise to what will be referred to hereinafter as an "operational mode failure", wherein an electronic, or other semiconductor device, initially exhibiting satisfactory electrical performance, suddenly fails. This type of failure will be discussed in further detail hereinbelow. It is believed the shunt defects, both latent and patent, arise from one or more irregularities in the (1) morphology of the substrate material, (2) in the growth of the intermediate semiconductor layers or (3) unintended inclusions within the deposited layers.

The first, and perhaps most important, source of the defects, i.e., the aforementioned morphological irregularities in the deposition surface of the substrate material will now be discussed. Even though the highest quality sheet glass or stainless steel is employed to serve as the substrate upon which the conductive base electrode (either transparent oxide or metallic) upon which the intermediate semiconductor layers and the overlying metallic electrode are successively deposited, it has been calculated that from 10,000 to 100,000 irregularities per square centimeter are present on the deposition surface thereof. Such irregularities take the form of projections, craters, or other deviations from a smooth finish and may be under a micron in: 1) depth below the surface; 2)

height above the surface; or 3) diameter. Regardless of their configuration or size, such defects may establish a low resistance current path through the intermediate semiconductor body, thereby effectively short-circuiting the two electrodes. This may occur in numerous ways. For instance, a spike projecting from the surface of the base electrode may be of too great a height to be covered by the subsequent deposition of semiconductor layers and therefore, be in direct electrical contact with the overlying metallic electrode when said electrode is deposited atop the intermediate semiconductor layers. Likewise, a crater formed in the surface of the substrate may be of too small a size to be filled by the subsequent deposition of the base electrode and semiconductor layers and therefore, be in sufficient proximity to the other electrode, when that electrode is deposited atop the semiconductor layers. In such an instance: 1) electrical current may bridge the gap which exists between the electrodes; or 2) during actual use of the electronic device, the material of one of the electrodes may, under the influence of the electrical field, migrate toward and contact the other of the electrodes, so as to pass electrical current therebetween and thereby give rise to an operational mode failure. It is also possible that in some cases the intermediate layers deposited onto the substrate or base electrode include regions of irregular composition which can provide low resistance paths for the flow of electrical current between the electrodes of the photovoltaic device.

Further, despite efforts to maintain a deposition vacuum envelope free of external contaminants, dust and other particulate matter may either invade the vacuum envelope during the deposition of the intermediate layer material, or forms as a by-product of the deposition process, which are deposited over the substrate electrode along with the semiconductor material. Such contaminants interfere with the uniform deposition of the intermediate layers and may establish low resistance current paths therethrough.

Additionally, it is suspected that in some cases, the intermediate materials form micro-craters or micro-projections during the deposition thereof, (even absent the presence of contaminants or external pollutants). Such morphological deviation from a perfectly smooth and even surface means that the substrate is covered by either: 1) an ultra-thin layer of material; or 2) not at all. Obviously, when the overlying metallic electrode material is deposited across the entire surface of the semiconductor body, the thin or open regions thereof create a low resistance current path. In still other cases, the presence of defect regions is only detectable by their deleterious effect upon the electrical and/or photoelectric properties of the resultant device.

In some instances, particular types of electronics devices may operate adequately in spite of the presence of such defects; however other devices, are significantly impaired in function by defects therein. While the defects described herein above may, in some instances, not be sufficiently severe to divert all electrical current through the low resistance path, the diversion or shunting of any current therethrough results in some loss in operational efficiency of the electronic device. Moreover, the shunting of even small amounts of current through each of thousands of defect regions will aggregate to cause major losses in efficiency. Based upon the foregoing, it should be apparent that a reduction in the number of defect regions is critical to the fabrication of high-yield, high efficiency, large area, thin film electronic devices.

Several approaches for dealing with this problem have been implemented in the past. As described in U.S. Pat. Nos. 4,451,970; 4,464,823; 4,510,674 and 4,510,675 of Masatsugu Izu and Vincent Cannella, the disclosures of which are incorporated herein by reference, the shunting of current through defect regions may be cured by substantially eliminating the defect regions as an operative area of the electronic device. This is accomplished in an electrolytic process wherein electrode material (in the preferred embodiment, indium tin oxide) is physically removed from the periphery of the defect site, effectively isolating the defect regions and preventing the flow of electrical current between the defect region and the electrode layer. As disclosed in U.S. Pat. No. 4,385,971 of Swartz, defect regions in a solar cell are electrolytically removed in a process which either etches, or bubble-blasts defective semiconductor regions from the solar cell, so as to physically remove material therefrom. However, in those instances where a current collecting structure such as a busbar system or a grid pattern is subsequently applied to the device, care must be taken in utilizing the aforedescribed processes so as to avoid having such conductive structure electrically contact the isolated defect, to avoid creating another short circuit. Consequently, insulating material is generally applied to the isolated regions. In U.S. Pat. No. 4,419,530 of Prem Nath, the disclosure of which is also incorporated herein by reference; there is described a method for electrically isolating defect containing small area segments of an amorphous, thin film, large area photovoltaic device. This isolation of defects is accomplished by: 1) dividing the large area device into a plurality of small area segments; 2) testing the small area segments for electrical operability; and 3) electrically connecting only those small area segments exhibiting a predetermined level of electrical operability, whereby a large area photovoltaic device comprising only electrically operative small area segments is formed.

While the method of Nath is effective in reducing or eliminating the effect of shunts, it is not completely satisfactory for several reasons. The step of dividing the semiconductor body into electrically isolated portions requires several production steps and also reduces the total area of the device. Further, the method can be time and cost intensive since the electrical output of each isolated portion must be individually tested and separate electrical connections must be made to provide electrical contact thereto. Also, since an entire segment is effectively eliminated from the final cell if it manifests a defect, losses of efficiency are greater than they would be if only the precise area of the particular defect were eliminated.

Further, U.S. Pat. No. 4,598,306 of Nath, et al., the disclosure of which is incorporated herein by reference, discloses the use of a resistive barrier layer interposed between the semiconductor body and one of the electrodes of a semiconductor device for limiting the amount of electrical current that can flow through defect regions. In this manner, the relatively large short circuit current flowing through defect regions is buffered by the current limiting resistance of the layer. While the foregoing method does improve the production yield of usable semiconductor devices, it interposes an additional series resistance therein, which resistance decreases the operational efficiency of the device.

Additionally, U.S. Pat. Nos. 4,590,317 and 4,633,033, the disclosures of which are incorporated herein, teach the use of various current collecting bus grid structures for the purpose of restricting short circuit current flow in semiconductor devices. According to the teachings therein, the current carrying capacity of grid systems of devices may be effectively restricted through the use of proper geometry, and/or materials. The limited current carrying capacity of such current collecting grids functions to buffer the effects of short circuit current flows through defect regions proximate thereto. While this system does significantly improve device yield, it obviously is of no use for semiconductor devices which do not include a current collecting grid structure therein; additionally, such grid structures, themselves, add some additional series resistance to the device.

Finally, U.S. Pat. Nos. 4,729,970 and 5,084,400, the disclosures of which are incorporated herein by reference, teach a methods of passivating short circuit defects in electronic devices having conductive electrodes. The '970 patent also teaches passivation of thin film electronic devices by employing either Lewis Acids or salts of amphoteric elements as the conversion reagents for passivation purposes. These disclosures teach passivation of current shunting circuit defects by altering the conductive oxide electrode or metallic electrode, proximate the defect regions.

In the past, techniques such as those disclosed in U.S. Pat. No. 4,729,970 ('970) have been sufficient to improve the yield of photovoltaic devices continuously deposited on elongated webs of stainless steel. However, as the instant assignee's technology for deposition of photovoltaic devices on elongated webs has advanced, the length of the webs on which the devices are deposited has become increasingly long. This means that the deposition chambers are in use longer between web changes and there is less down time. This is advantageous in that less down time means higher productivity and higher overall output for any give production machine. Unfortunately, a problem has developed. As the length of the web increases, the length of use of the deposition chambers also increases, and the chamber is purged/cleaned less often, resulting in an increased amount of particulate in the chamber. The inventors have discovered that in long runs, the low light voltage of $V_{LL}$ photovoltaic devices drops off after a certain point in the web, and continues to do so drastically, such that a significant portion of the tail end of the web is unusable for production of saleable photovoltaic devices. Thus, gains in productivity by using longer webs are undercut by losses in saleable yield. FIG. 1 graphs the $V_{LL}$ in millivolts versus the device number for two deposition runs. As can be seen from the run where the devices are passivated by the standard, prior art passivation technique (symbol ♦, 5V for 2 sec.), the higher device number (later in the deposition run) begin to have lower $V_{LL}$ until eventually at about device number 4500 or so, the $V_{LL}$ is below the acceptable limit of 900 mV.

While not wishing to be bound by theory, the instant inventors believe that the fall off of the low light voltage is due to a significant increase in the number of particles formed in the semiconductor deposition chamber (which eventually attach to and are incorporated into the device) as the length of the run is increased. This results in a higher number of shunt defects in the devices. Passivating the cells which have a larger density of shorting defects in the manner as described in the '970 patent results in decreased low light voltage. To increase the low light voltage, the defects must be more fully isolated. Toward this end, passivation processing time may be increased, but in so doing it has been found that a point is reached where a larger good area of the conductive electrode surrounding the defects is converted and changed in color, resulting in cosmetically unacceptable spots and a thinner top conducting oxide later. Thus there is a strong felt need in the art for a method of increasing the effectiveness of the passivation process to reduce the isolation loss of viable photovoltaic material while still properly passivating the short circuit shunts.

SUMMARY OF THE INVENTION

The present inventors have found that certain modifications and additions to the prior art short passivation technique have lead to improvements in the low light voltage of solar cells which are made using the improved passivation technique. In accordance with exemplary embodiments of the present disclosure modifications include:

A method for passivating short circuit defects in a thin film large area photovoltaic device is provided. The method employs a passivation agent and a counter electrode disposed in said passivation agent. The method includes controlling an application of current between the substrate of said photovoltaic device and said counter electrode so as to ensure high selectivity of modification of a transparent conductive oxide material of said photovoltaic module adjacent said short circuit defect, while leaving the transparent conductive oxide material of said photovoltaic module of non-defect areas in its unmodified form.

The method includes controlling the application of the current by applying a plurality of current pulses to the photovoltaic device, wherein at least one of the current pulses is a reverse current pulse.

The method includes controlling the application of the current by applying a plurality of current pulses where a first forward current pulse is supplied to the photovoltaic device and a subsequent step includes a reverse current pulse supplied to the photovoltaic device.

The method for controlling the application of the current to the photovoltaic device, wherein a first forward current pulse is supplied to the photovoltaic device, a subsequent step includes a reverse current pulse supplied to the photovoltaic device, and another subsequent step includes supplying a second forward current pulse.

DETAILED DESCRIPTION OF THE INVENTION

Figure 1:
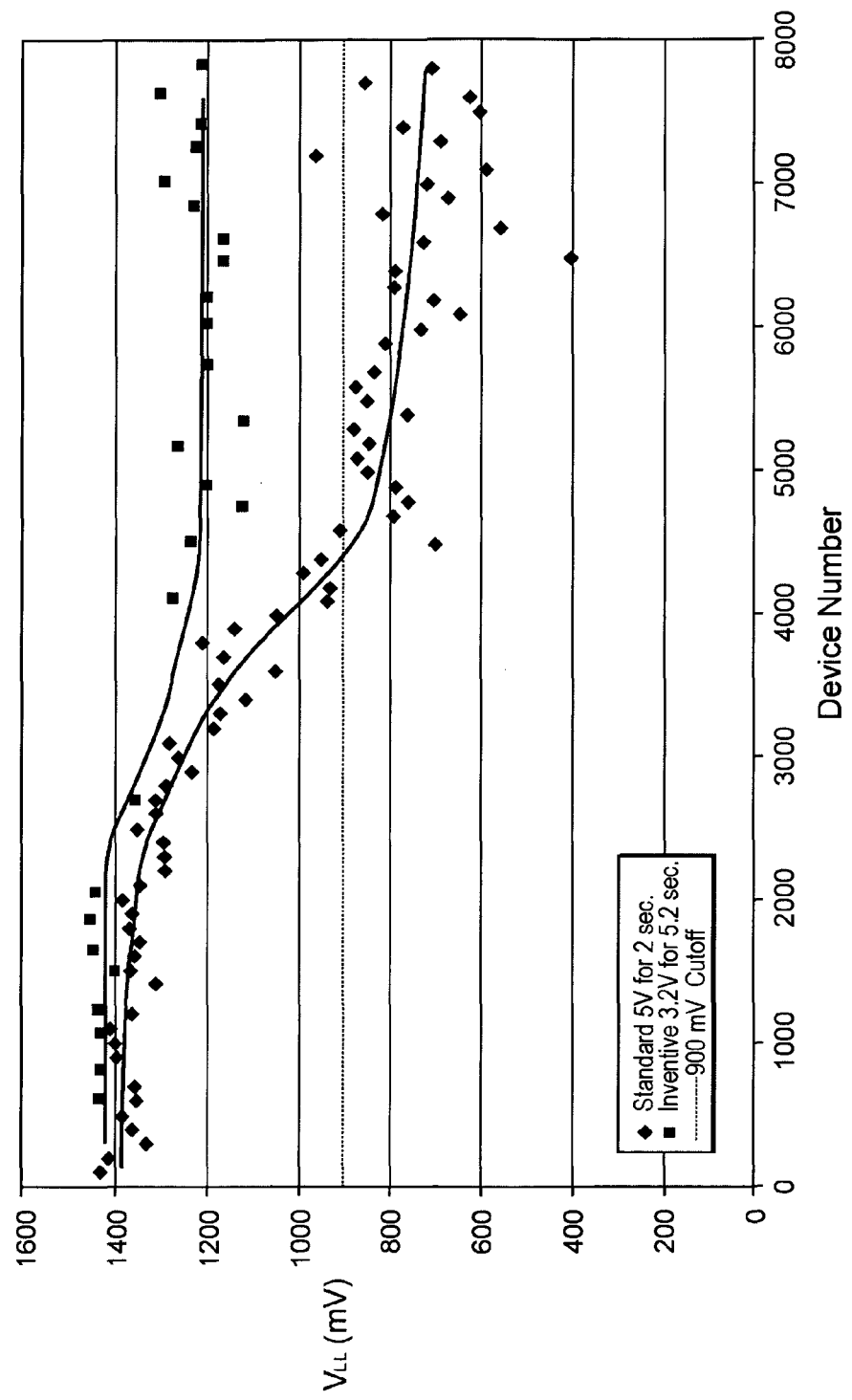
FIG. 1 graphs the $V_{LL}$ in millivolts versus the device number for two deposition runs, one using the prior art passivation technique and one using an embodiment of a passivation technique of the present disclosure.

The instant inventors have discovered that certain modifications and additions to the technique of the '970 patent have lead to improvements in the low light voltage of solar cells which are made using the improved passivation technique. Therefore, in its most generic sense, the instant invention comprises applying electrical and/or light energy to the photovoltaic device (which is immersed in an electrolytic passivation agent) in such way as to selectively minimize the isolation of non-shorted active semiconductor material from the electrode, while maximizing the isolation of short circuit shunts. To do this the inventors have changed the conditions of the applied energy. The following modifying techniques of the '970 patent have been found to be successful:

1) reducing the voltage bias on the cell while increasing the time of application of the voltage;
2) reversing the polarity of the voltage bias on the devices;
3) alternating pulsing between forward and reverse polarity bias; or
4) applying light energy simultaneously with an electrical bias voltage.

In general the prior art processing used in production by the instant assignee comprises immersing the photovoltaic device in a passivation agent, adapted to modify the electrically conductive electrode material adjacent to the shunting defects and thereby isolate the defect regions. In this manner, the defect regions are substantially electrically isolated from the remainder of the electrode.

The specifics passivation agent used in the production process of the prior art include either an aqueous electrolyte solution of $AlCl_3$ or $H_2SO_4$. An activating voltage is applied to the photovoltaic device such that the bottom electrode of the photovoltaic device is connected to the negative electrode and a positive electrode is placed in the electrolyte adjacent the photovoltaic device. The applied voltage is about 5.0 volts and the duration of the voltage/immersion is about 2 seconds.

As has been mentioned above with respect to FIG. 1, the prior art passivation technique has been adequate until recently, when the coil length of the web of deposition substrate was increased from 800 meters to 1700 meters (with aims to increase to 2500 meter runs). This increase in run length has unacceptably decreased the low light voltage ($V_{LL}$) of solar modules produced from a substantial portion of the production run. Thus a good portion of the extended length of the production run has unacceptably low $V_{LL}$. The present modifications of the prior art production passivation techniques improves the $V_{LL}$ of these devices. The new techniques provide for greatly increased yield over the prior art techniques, even and especially at extended length production runs. Typically, the new passivation techniques gives yields greater than about 90% and more specifically greater than about 95% for coil lengths of 1700 meters to 2500 meters and even longer. The prior art passivation technique typically gave about yield of 87% or less on coils of 1200 meters or less.

Reduced Voltage—Increased Time

The present inventors have found that if the applied voltage of passivation is reduced significantly over the prior art production passivation voltage and the duration of application of the lowered voltage is significantly increased over the duration of the prior art production technique, the devices of the latter portion of the production web have increased $V_{LL}$. That is, the inventors have unexpectedly found that increasing the time of passivation, while reducing the voltage of passivation has resulted in higher selectivity of passivation of the shorted portions of the devices over the non-shorted portions (good areas) of the device. This is unexpected in that reduction of voltage with concurrent lengthening of the passivation duration would be expected to merely give the equivalent passivation as higher voltage, shorter duration passivation.

The instant inventors have modified the passivation process for production devices by decreasing the applied voltage from the standard 5.0 volts to 3.2 volts, and have increased the duration of the passivation from 2.0 seconds to 5.2 seconds. This has resulted in a substantial increase in the average $V_{LL}$ of the produced devices. The electrolyte or passivation agent (used herein interchangeably) in both instances was an identical aqueous $H_2SO_4$ solution typically used in assignee's commercial production of photovoltaic devices. Returning to FIG. 1, it can be seen that the passivation technique of this embodiment of the present invention (symbol ■, 3.2V for 5.2 sec) has substantially increased the number of acceptable ($V_{LL}$ above 900 mV) devices. The x-axis of FIG. 1 is 8000 devices, which is equivalent to 1900 meters. The yield for this particular 1900 meter long run with the prior art passivation method is only 59%, whereas with the new recipe it is 100%.

In this embodiment of the modified passivation process of the instant invention, the applied voltage is preferably on the order of less than 3.5 volts, more preferably 2.5 to 3.5 volts and most preferably from 2.7 to 3.2 volts. The passivation duration is preferably on the order of greater than 4.5 seconds, more preferably 4.5 to 20 seconds, and most preferably 5.2 to 15 seconds.

Figure 2A:
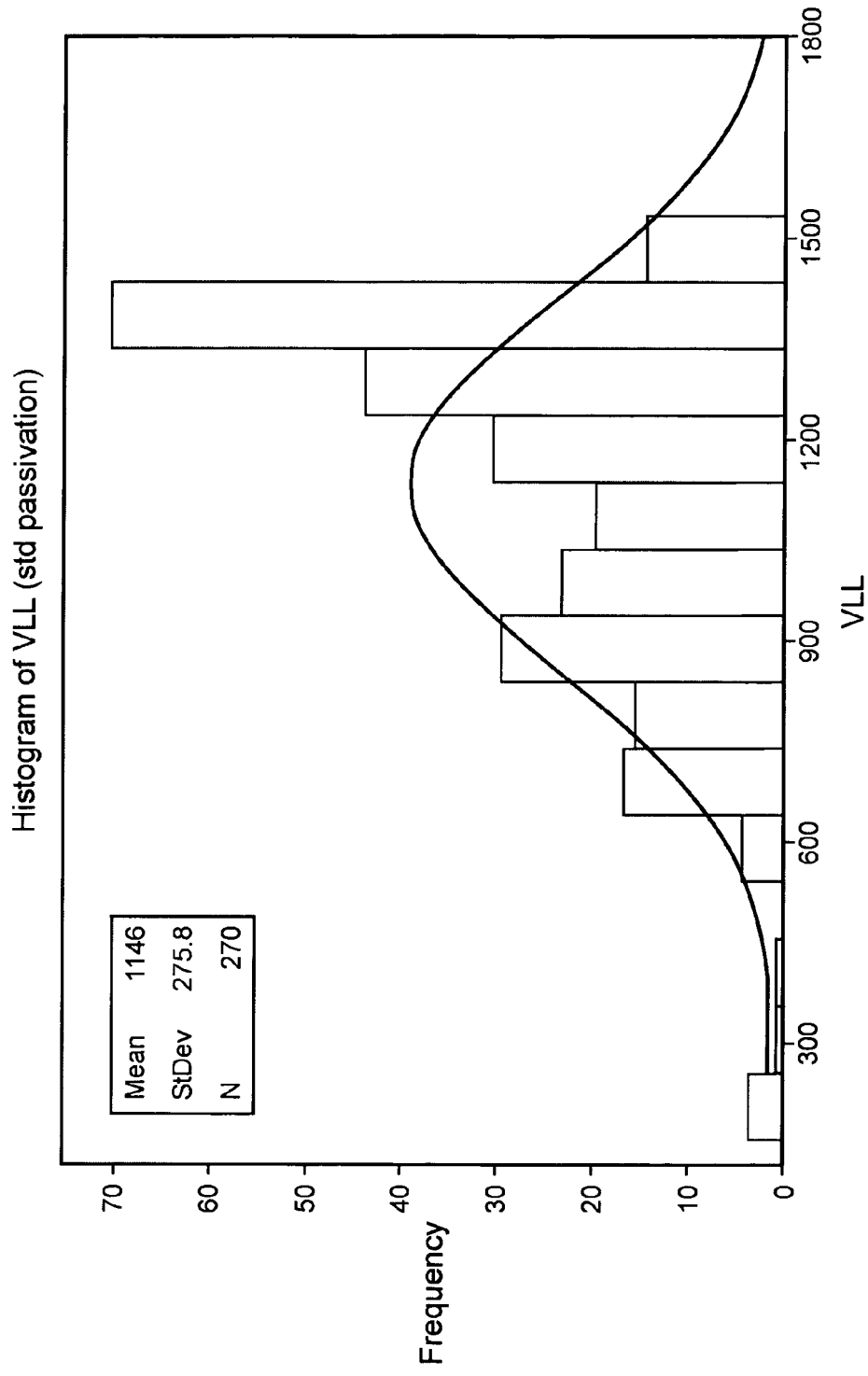
FIGS. 2a and 2b are graphs which plot in bar chart form the number of devices (frequency) versus the $V_{LL}$ range (groups of 100 mV, i.e. 550-650 mV etc.) for the devices made by the standard prior art commercial passivation technique and an embodiment of a passivation technique of the present disclosure, respectively.
Figure 2B:
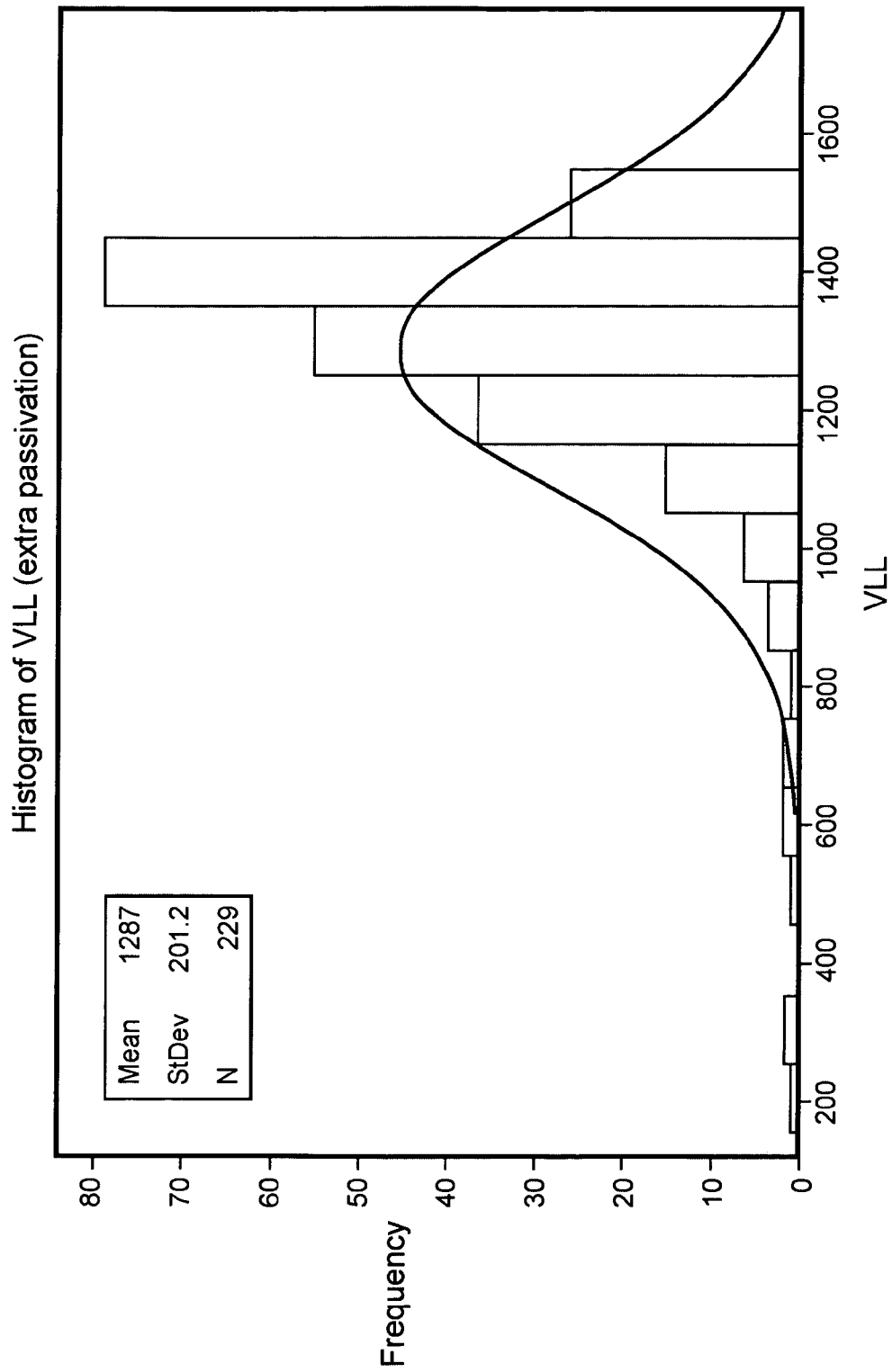

FIGS. 2a and 2b are graphs which plot in bar chart form the number of modules (frequency) versus the $V_{LL}$ range (groups of 100 mV, i.e. 550-650 mV etc.) for the devices made by the standard commercial passivation technique, and this embodiment of the inventive passivation technique, respectively. As can be seen, the mean $V_{LL}$ has increased from 1146 mV for the standard passivation technique to 1287 mV for the inventive passivation technique. Also note that the number of devices below the 1150 to 1250 mV range has been significantly reduced by utilization of the inventive passivation technique.

Figure 3:
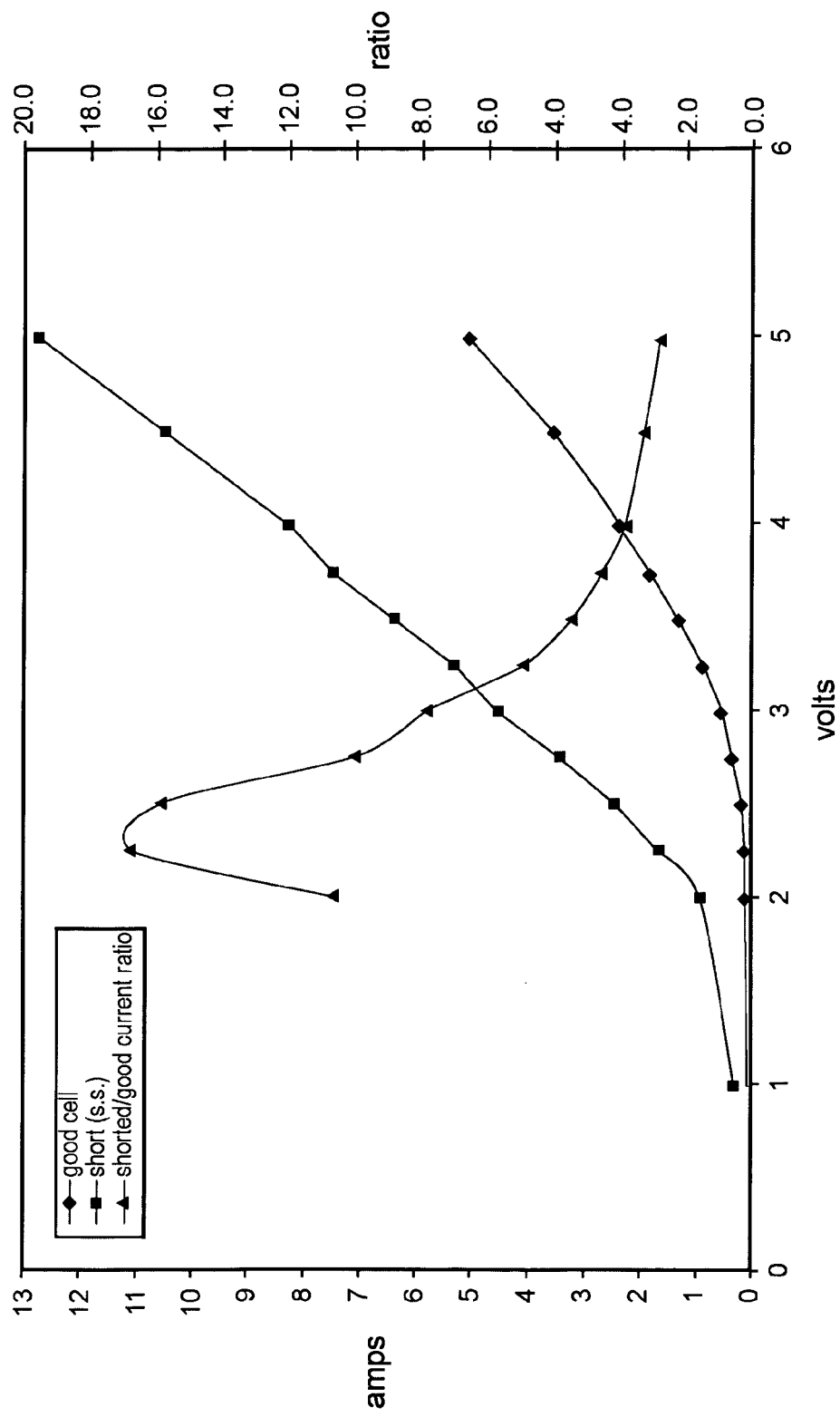
FIG. 3 illustrates plots of I-V curves of photovoltaic devices within a passivation bath.

FIG. 3 plots I-V curves of photovoltaic devices within a passivation bath. The applied voltage across the device is plotted on the x-axis and the induced current is plotted on the y-axis. One curve is for a good, non-shunted device (symbol ♦), another is for a worst case shorted cell (symbol ■). Also plotted is the ratio of the shunted device current to the good device current, versus applied voltage. As can be seen from FIG. 3, the ratio of current across the shunted portion versus the current across the non-shunted portion reaches a maximum around 2.2 volts or so. Physically, this indicates that passivation at this point should create the greatest selectivity between the shunted and non-shunted portions of the device, since the shunted portions have a significantly higher current flowing therethrough. Thus the voltage applied to the device during passivation should be in a range where the ratio of the current passing through the shunted portion of the device to the current passing through the non-shunted portion of the device is significantly high, on the order of 4:1 or greater, more preferably on the order of 6:1 or greater and most preferably on the order of 8:1 or greater.

While actual numerical values are shown in FIG. 3, these numbers are for a specific type of photovoltaic module (triple junction) and a specific passivation system. The specific values for voltage and current can vary from those shown. What is to be gleaned from the information is that there is a regime for any device/system combination where the selectivity of passivation can be enhanced to target the shunted portions of the photovoltaic device. All that is needed is to determine the ratio of the current through the shunted to the current through non-shunted portions of the device at a range of voltages and to plot that ratio versus voltage. Once that is accomplished, one can determine the proper voltage to apply. Then the proper voltage may be applied to the devices for as long as necessary to raise the low light voltage to an acceptable level.

Reverse Polarity

Another embodiment of the instant invention involves reversing the polarity of the applied voltage from that of the prior art while passivating photovoltaic devices. Thus, photovoltaic devices which have been produced late in the deposition run have been passivated in an aqueous solution I of $AlCl_3$. The concentration of the $AlCl_3$ was adjusted to give a solution conductivity of 40 milliohms. The polarity of the applied voltage is opposite of that used in production. Standard passivation for production places the device at the negative terminal of the power supply. In this case, the device to be passivated is positive with respect to the counter electrode. The voltage between the device and the counter electrode was set to is 4.0 Volts. The voltage was pulsed at 1 second intervals (50% dwell time) and 20 total pulses were required to achieve low light voltage of 1400 milivolts. Thus, this reverse polarity embodiment of the present invention can also improve the selectivity of the passivation of short circuit shunts over the process of the prior art.

Alternating Foreward/Reverse Pulsing

The inventors have also used alternating forward/reverse voltage pulses to passivate devices which have been produced late in the deposition run. The voltage on the device with respect to the counter electrode was alternated between +0.6 V and −6 volts. The devices were pulsed at ten pulses per second. One device was passivated by 125 such pulses and showed a final $V_{LL}$ of 1000 mV. The passivation electrolyte was an aqueous solution of $H_2SO_4$. Thus, the alternating forward/reverse voltage pulses have a significant effect on the selectivity of the passivation of short circuit shunts over the process of the prior art.

Current Control Method

The inventors have further determined that selective passivation can be accomplished by controlling an application of current supplied to the photovoltaic device. It has been found that quantities of solar cells passivated by a current control method can consistently exhibit higher $V_{LL}$ values compared to quantities of solar cells passivated by the voltage control method such as those embodiments discussed hereinabove.

The application of voltage control to passivate solar cells is influenced by variation in electrical strip contact resistance and positioning/aligning of the electrical contacts. For example, if the electrical contacts are relatively small in thickness or width, or the contacts are not aligned well, it is possible that significantly less current will flow through the circuit. Additionally, the contacts can be susceptible to corrosion, for example in the case of copper strips, further resulting in reduced current flow over time. It is desirable to provide an appropriate amount of current to the photovoltaic device during the passivation process to reduce the conducting portion of the transparent conductive oxide in the defect areas or shunts (short circuit defects). Controlling current flow in the circuit overcomes the issues discussed hereinabove and efficiently passivates the photovoltaic device of the conducting defects.

Figure 4:
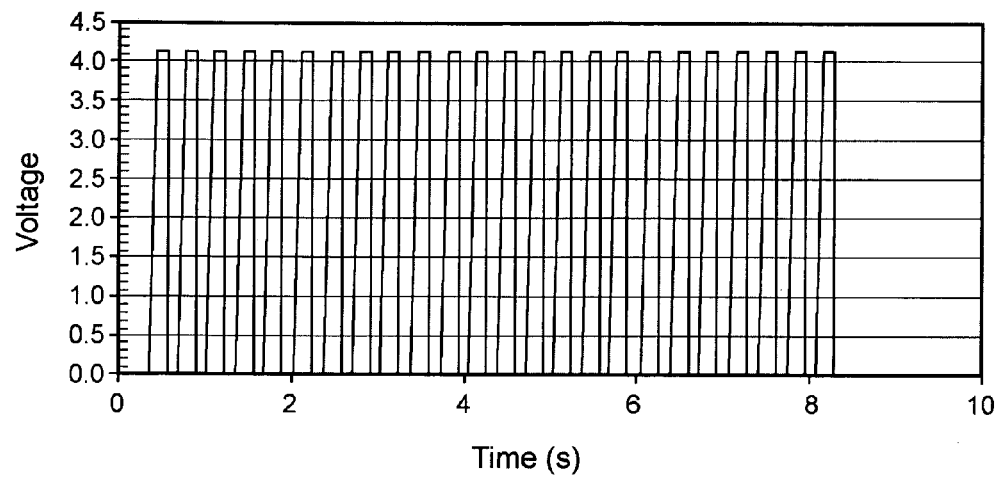
FIG. 4 is a plot of voltage pulses over time during a voltage control mode in accordance with an exemplary embodiment of the present disclosure.
Figure 5:
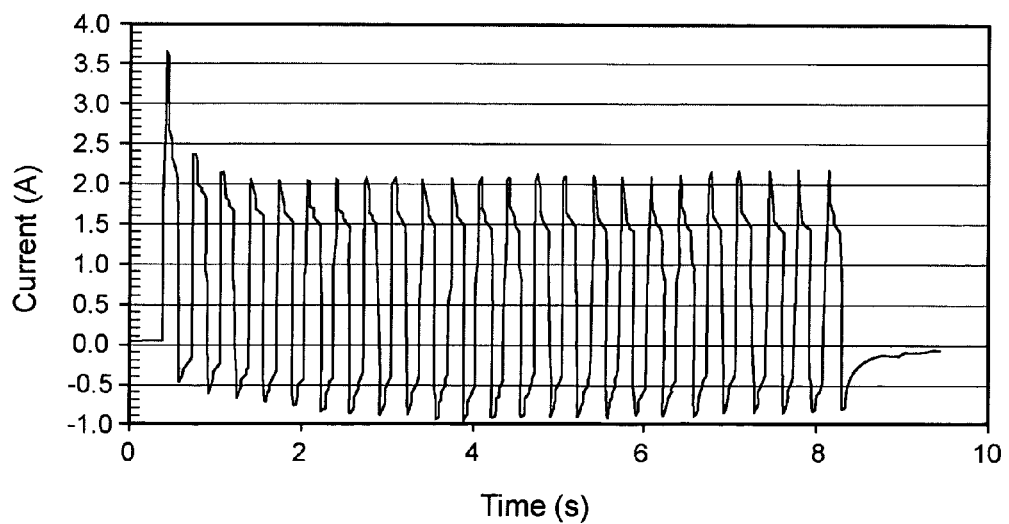
FIG. 5 is a plot of current pulses over time during a voltage control mode.
Figure 6:
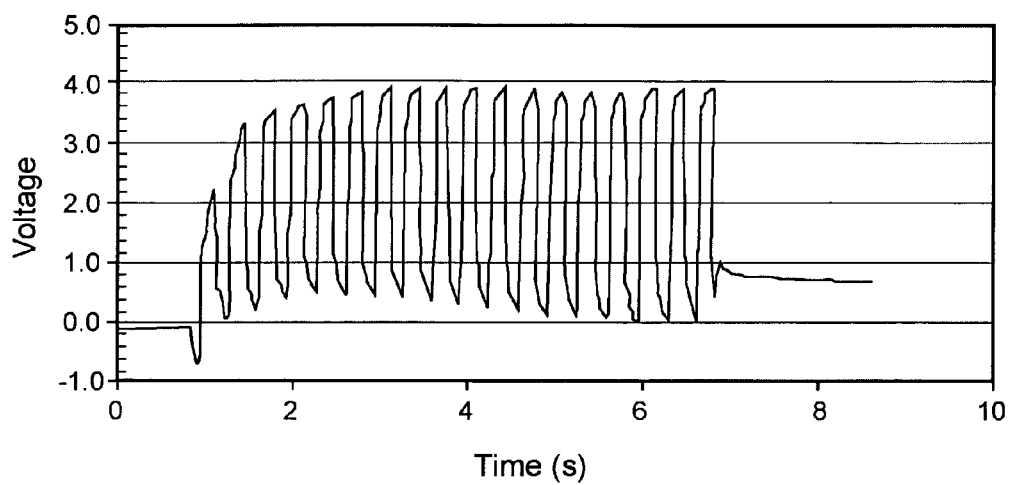
FIG. 6 is a plot of voltage pulses over time during a current control mode in accordance with another exemplary embodiment of the present disclosure.
Figure 7:
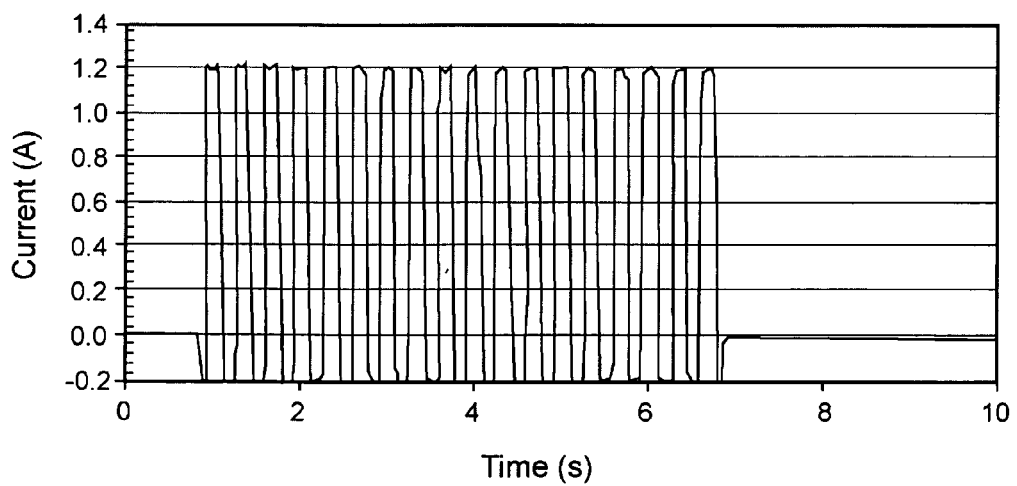
FIG. 7 is a plot of current pulses over time during a current control mode.

FIGS. 4 and 5 illustrate plots of voltage over time and current over time, respectively, for example, for an application where the voltage is controlled during a passivation process of a solar cell. FIGS. 6 and 7 illustrate plots of voltage over time and current over time, respectively, for example, for an application where the current is controlled during a passivation process of a solar cell.

FIG. 5 illustrates an instantaneous current spike at the initial applied voltage drop applied across the solar cell. This instantaneous current spike can severely degrade the solar cell's operational performance or render it inoperable. FIGS. 6 and 7 illustrate a passivation process where the potentially damaging instantaneous current spike is avoided by controlling the application of current supplied to the solar cell during the passivation process.

Another consideration is that the voltage potential across the photovoltaic device varies during the passivation process due at least in part to oxide formations during the passivation process. The current supplied to the photovoltaic device during the passivation process has an influence on the thickness of the transparent conductive oxide (TCO) layer (non-limiting examples include ITO, ZnO) in that once the current flows through the shunt it then can flow beyond the shunt with an effect of possibly reducing the ITO beyond the radius of the shunt. Additionally, if an appropriate current is not supplied to dissolve, in the solution/bath or passivation agent, the conducting portion reduced from the shunt, valuable current then flows through the undissolved conducting portion leaving less current to reduce shunts. Therefore, controlling the current supplied to the photovoltaic device during the passivation process provides better control to avoid incurring a damaging current spike and for timely dissolving reduced shunt conducting portions (in the case of ITO, indium metal oxide) in the passivation solution bath.

Further for manufacturing efficiency, another objective is to passivate the photovoltaic device in a minimum amount of time. It is desirable to dissolve the indium metal from the shunt since the indium metal is more conductive than the ITO it is reduced from. It is desirable to dissolve the indium metal quickly so that the applied current does not spread to unshunted areas of the solar cells and thus more current is timely available for reducing the remaining shunts.

In an exemplary embodiment, passivating solar cells utilizing current control entails several steps. For example, a forward biased current, or a pulsed current, is supplied to the solar cells. In the case where the solar cell comprises an indium tin oxide (ITO) layer this forward biased current reduces an amount of ITO on a surface of the shunt to indium metal. After the forward bias current is applied, one or more shunts may at that time still be in a conducting state. Subsequent to the application of the forward bias current, a reverse bias current is supplied to the solar cells to dissolve the indium metal from the shunt into the passivation bath. In an exemplary embodiment, a bipolar power supply is utilized to supply the reverse current. The inventors herein have found the application of a reverse current enhances the dissolution of the conducting portion of the reduced shunt, particular for indium dissolution. In exemplary embodiments, cycles of application of forward and reverse currents to the solar cells is repeated to remove layers of ITO until the ITO in the shunt is substantially removed, leaving a microscopic pit in the cell at the location of the prior conducting shunt.

To compare passivation results between the voltage control method and the current control method 40 slabs of solar cells were chosen from the same manufacturing run. The slabs were divided into groups and randomized to minimize the influence of variation of slab areas within the slab run. Two groups of slabs were selected for passivation utilizing the voltage control method and two groups of slabs were selected for passivation utilizing the current control method. All slabs from the groups were given the same treatment before and after the passivation methods. $V_{LL}$ was measured with a 6-point method and the average voltage over the 6 points was taken as the $V_{LL}$ for the slab.

The slabs passivated using the voltage control method were subjected to 4.1V, 3 Hz, 2×8 seconds, and no reverse current was applied during the passivation steps.

In an exemplary embodiment of using the current control method, an equal number of slabs of solar cells were passivated according to the following parameters. A first forward biased current pulse of 1.2 A for pulse time of 167 milliseconds (ms) was supplied to the cells. Subsequently, a reversed biased current pulse of −0.2 A for a pulse time of 500 ms was supplied to the cells, utilizing a bipolar power supply. Subsequently, a second forward biased current pulse of 1.3 A for pulse time of 167 milliseconds (ms) was supplied to the cells. The above steps where repeated to substantially eliminate shunts from the solar cells, for a current pulse train of approximately 24 pulses, approximately 16 seconds. In other embodiments the values of forward and reverse currents and total pulse train may vary depending on the configuration and quantity of the solar cells, solar cell internal resistance, nature of the shunts, solution bath parameters, electrode spacing, temperature, etc. In a non-limiting example, the rate of ITO reduction is approximately 50 nm per 0.1 A-s/cm$^3$ in both sulfuric acid and AlCl$_3$ solution baths.

Under the current control method, the average $V_{LL}$ after passivation of the slabs was 1.09V and 61% of the slabs had $V_{LL}$ values above 1.10V, a predetermined acceptable $V_{LL}$ level. Under the voltage control method, the average $V_{LL}$ after passivation of the slabs was 0.79V with 5% of the slabs having $V_{LL}$ values above 1.10V. The passivation results from the current control method in this comparison experiment represent a significant improvement compared to the passivation results of the voltage control method.

Combine Light and Electrical Energy

In this embodiment, both light energy and electrical energy are applied simultaneously to the device. The voltage of the electrical bias and the photo-generated voltage produced by the non-shorted areas of the devices offset each other such that current flow within the good areas of the device is substantially reduced or eliminated, while current continues to flow in the shunted portions of the device. This allows for high selectivity of passivation of the electrode material in contact with the shunted portions of the device while leaving the electrode material connected to the active portions of the device intact. For example, a device is biased with a −2V versus the counter electrode. Simultaneously, light energy is projected onto the photovoltaic device such that the device creates a counter voltage of approximately 2V. This photo-generated counter voltage offsets the applied voltage over the active portions of the device, but does not counter the applied voltage at the shunts. The electrode material over the shunts is selectively passivated, leaving the electrode material over the active area substantially unchanged. This embodiment of the inventive passivation technique has increased the $V_{LL}$ of shunted devices to between 1000 to 1400 mV.

The inventors herein have realized that poor low light voltage ($V_{LL}$) will result in the event a shunt that has been reduced to indium but where the indium has not been dissolved away, thereby conducting an amount of current that could otherwise be utilized to reduce shunts that still exist and need to be reduced. Consequently, it is desirable that any indium formed during the passivation be removed before the application of another reducing current pulse.

It should finally be noted that although the instant invention has been described primarily with reference to photovoltaic devices, it can obviously be utilized with any electronic device in which defect regions create short circuit problems. For example, the instant invention may be utilized to passivate defects in devices such as capacitors, photosensors, liquid crystal display devices, diodes, threshold switches, memory devices and various arrays and combinations thereof. It should therefor be recognized that the foregoing examples, description and discussion are merely meant to be illustrative of the principles of the instant invention and not meant to be a limitation upon the practice thereof. It is the following claims, including all equivalents, which are meant to define the scope of the instant invention.

What is claimed is:

1. A method for passivating short circuit defects in a thin film large area photovoltaic device having a substrate and an indium-tin-oxide (ITO) conductive top layer adjacent said short circuit defects, said method employing a passivation agent, and a counter electrode disposed in said passivation agent, the method comprising:
  applying a pairs of current pulses between said substrate of said photovoltaic device and said counter electrode in the presence of said passivation agent, until said short circuit defects are passivated; wherein said pair of current pulses include:
    a) a first current pulse having a first bias, a first amperage and a first duration; and
    b) a second current pulse having a second bias which is opposite that of said first bias, a second amperage and a second duration;
  wherein said first bias, first amperage and first duration of said first current pulse reduces an amount of ITO adjacent said short circuit defects to indium metal in the presence of said passivation agent; and
  wherein said second bias, second amperage and second duration of said second current pulse dissolves said indium metal from around said short circuit defects into said passivation agent.

* * * * *